United States Patent [19]

Vasile

[11] Patent Number: 5,049,835
[45] Date of Patent: Sep. 17, 1991

[54] MODIFIED CASCODE CIRCUIT

[75] Inventor: Carmine F. Vasile, Medford, N.Y.

[73] Assignee: Grumman Aerospace Corporation, Bethpage, N.Y.

[21] Appl. No.: 485,495

[22] Filed: Feb. 27, 1990

[51] Int. Cl.⁵ .............................................. H03F 3/16
[52] U.S. Cl. .................................. 330/277; 330/295; 330/311
[58] Field of Search ........................ 330/277, 311, 295

[56] References Cited

PUBLICATIONS

Osafune et al., "A Low-Noise GaAs Monolithic Broad-Band Amplifier Using a Drain Current Saving Technique", *IEEE Transactions on Microwave Theory and Techniques*, vol. MTT-33, No. 6, Jun. 1985, pp. 543-545.
Zhuravlev et al., "Amplifier for Semiconductor Gamma Detectors", *Instruments and Experimental Techniques*, (U.S.A.), No. 2, Mar., Apr., 1970, pp. 460-463.

Primary Examiner—James B. Mullins
Attorney, Agent, or Firm—Pollock, VandeSande & Priddy

[57] ABSTRACT

Conventional cascode circuits achieve a performance which is not optimum. To enhance performance, the cascode circuit of the present invention has an input stage FET that has a saturation current which is greater than the saturation current of the output stage common gate FET. Since the maximum power of a cascode circuit is related to the maximum voltage swing at the drain of the common gate FET, when the saturation current of the common source FET is greater than that of the common gate FET, the common source FET essentially acts as a switch to turn the common gate FET fully on, without dissipating any appreciable voltage from the same, so that a maximum voltage swing may be produced at the drain of the common gate FET.

13 Claims, 6 Drawing Sheets

1 μm gate length Power MESFET

| PARAMETER and CONDITIONS | SYMBOL | UNITS | MIN | TYPICAL | MAX |
|---|---|---|---|---|---|
| Pinch off voltage at $V_{ds}$ = 3 v and $I_{dd}$ = 1 mA/mm | $V_p$ | volts | -3.5 | -4 | -4.5 |
| DC Transconductance $V_{ds}$ = 3v and $V_{gs}$ = -.5 and -1v | $g_m$ | mS/mm | — | — | — |
| Saturated Drain Current at $V_{ds}$ = 3v and $V_{gs}$ = 0v | $I_{dss}$ | mA/mm | 264 | 310 | 357 |
| Gate to drain breakdown voltage at $I_{gd}$ = 10 μA | $BV_{gdo}$ | volts | 16 | 18 | 20 |

$$
\text{CS CLASS-A} \begin{cases} V_S & & & 2 & & \\ V_{ACPP} & & 10 & 12 & 14 \\ P_{AC} & \begin{matrix}w\\(dBm)\end{matrix} & \begin{matrix}.388\\(25.9)\end{matrix} & \begin{matrix}\boxed{.465}\\\boxed{(26.7)}\end{matrix} & \begin{matrix}.543\\(27.3)\end{matrix} \\ V & & 7 & 8 & 9 \end{cases} \begin{matrix} V_P = -4 \\ I_{DSS} = 310 \\ V_B \text{ varied} \end{matrix}
$$

$$
\text{POWER ADDED EFFICIENCY} = \frac{1}{4}\frac{V_{PP}}{V_{DC}} = \eta_{add} \quad .357 \quad \boxed{.375} \quad .39
$$

FIG. 10a $$
\text{CLASS-B} \begin{cases} V_{ACPP} & & 6 & 8 & 10 \\ P_{AC} & \begin{matrix}w\\(dBm)\end{matrix} & \begin{matrix}.233\\(23.7)\end{matrix} & \begin{matrix}\boxed{.31}\\\boxed{(24.9)}\end{matrix} & \begin{matrix}.388\\(25.9)\end{matrix} \\ V_{DC} & & 5 & 6 & 7 \end{cases} \begin{matrix} V_P = -4 \\ I_{DSS} = 310 \\ V_B \text{ varied} \end{matrix}
$$

$$
\text{POWER ADDED EFFICIENCY} = \frac{\pi}{8}\frac{V_{PP}}{V_{DC}} = \eta_{add} \quad .47 \quad \boxed{.523} \quad .561
$$

FIG. 10b    FIG. 10c

MODIFIED CACCODE (MC)

$$
V_S = 0
$$

$$
\text{CLASS A or B} \begin{cases} V_{ACPP} = & & 16 & 18 & 20 \\ P_{AC} = & \begin{matrix}w\\(dBm)\end{matrix} & \begin{matrix}0.62\\(27.9)\end{matrix} & \begin{matrix}\boxed{0.698}\\\boxed{(28.4)}\end{matrix} & \begin{matrix}0.775\\(28.9)\end{matrix} \\ V_{DC} = & & 8 & 9 & 10 \end{cases} \begin{matrix} V = -4 \\ I_{DSS} = 310 \\ V_B \text{ varied} \end{matrix}
$$

POWER ADDED EFFICIENCY

CLASS A  $\eta_A$ =   .5   $\boxed{.5}$   .5

CLASS B  $\eta_B$ =   .785   $\boxed{.785}$   .785

MODIFIED CASCODE CIRCUIT

FIELD OF THE INVENTION

The present invention relates to cascode circuits and more particularly to a modified cascode circuit to be used in amplifier circuits to enhance output power thereof.

BACKGROUND OF THE INVENTION

In conventional cascode circuits wherein two transistors are connected—with a common emitter input stage transistor connected to a common base output stage transistor (or a common source connected to a common gate if the transistors happen to be field effect transistors (FETs) or metal-semiconductor field effect transistors (MESFETs)), the input and output stage transistors are of the same size. In other words, both the input and output stage transistors have the same saturation current. As a consequence, the performance obtained from circuits using conventional cascode circuits often is found lacking—in terms of power, voltage, efficiency, etc.

BRIEF DESCRIPTION OF THE PRESENT INVENTION

It has been found by the inventor that a cascode circuit which has a bigger semiconductor device in the first input stage than the semiconductor device in the second output stage is able to enhance the performance of the circuit, compared to a conventional cascode circuit, by as much as 30% to 60%. To provide for a bigger input, the first stage transistor is manufactured such that it has a saturation current which is approximately 1.5 to 2 times the saturation current of the second stage transistor. With a saturation current which is greater than that of the driver stage transistor, the input stage transistor is able to act essentially as a switch to ensure that the current of the output driver transistor approaches its saturation current, IDss. This in turn leads to the driver stage transistor being able to provide maximum voltage swing for signals input thereto, thereby enhancing the performance of the circuit.

For the input stage of the cascode circuit of the present invention, it has further been found that such stage can be made from a plurality of transistors which are identical to that of the output stage; or, alternatively, as in the case of the different components of the circuits being manufactured onto a single substrate as FETs, the direct manufacturing of a FET for the input stage that has greater saturation current limit than the FET for the output stage.

It is, therefore, an objective of the present invention to provide a cascode circuit which has enhanced performance over conventional cascode circuits.

It is another objective of the present invention to provide for a cascode circuit that can either be made from identical discrete components or different components built onto the same substrate.

BRIEF DESCRIPTION OF THE FIGURES

The above-mentioned objectives and advantages of the present invention will become more apparent and the invention itself will be best understood by reference to the following description of embodiments of the invention taken in conjunction with the accompanying drawings, wherein:

FIG. 10a shows, among other results, the resulting power added efficiency and voltage swing of a class A amplifier circuit using a conventional cascode circuit;

FIG. 10b shows, among other things, the power added efficiency and voltage swing of a class B amplifier circuit using a conventional cascode circuit;

FIG. 10c shows the power added efficiency and voltage swing of class A and B amplifier circuits using the present invention cascode circuit.

DESCRIPTION OF THE PRESENT INVENTION

Figure 2:
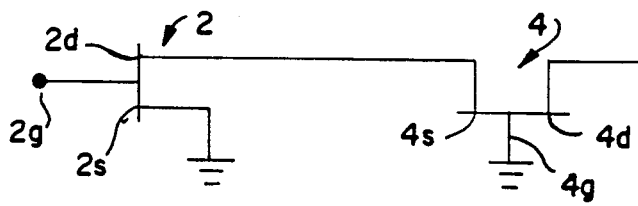
FIG. 2 is a cascode circuit of the present invention which has a single input stage common source FET connected to a common gate FET.

A basic cascode circuit, as illustrated in FIG. 2 (ignoring for the moment that FIG. 2 actually represents a present invention cascode circuit), is comprised of a common source FET 2 (or a common emitter transistor) connected, by means of its drain 2d, to a common gate FET (or a common base transistor) at its source 4s. Drain 4d of FET 4 provides the output for the cascode circuit. As is well known, common source FET 2 has its source 2s and common gate 4 has its gate 4g connected to ground.

In the case of a conventional cascode circuit which also has an input stage (driver stage) common source FET connected to a second stage (output stage) common gate FET, both of the common source and common gate FETs, before the present invention, have the same saturation current, IDss. Thus, as the common source FET saturates, it dissipates voltage and reduces current of the common gate FET of the circuit. As a consequence, the output voltage swing and current swing from the drain of the common gate FET is substantially reduced. Putting it simply, the voltage swing provided at the output of a conventional cascode circuit does not measure up to the maximum voltage swing which can be afforded by the output stage common gate FET of the circuit.

Figure 1:
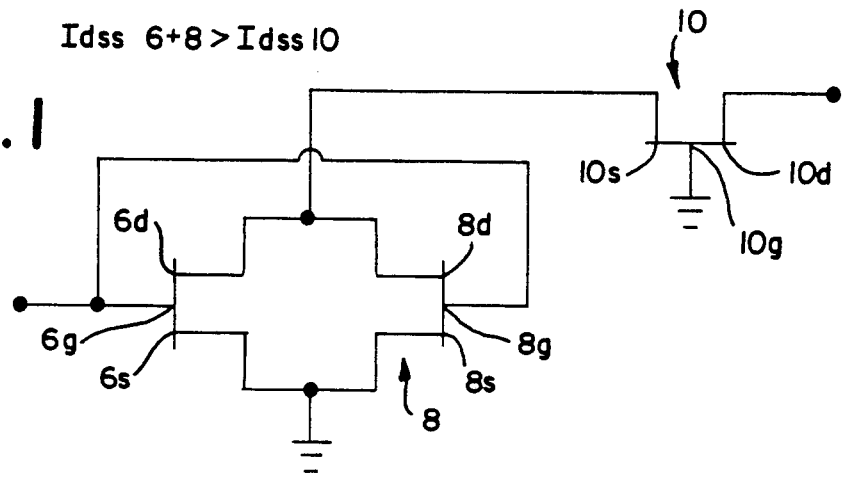
FIG. 1 is a schematic of a modified cascode circuit of the present invention which has its input stage comprised of two FETs.

With reference to FIG. 1, by empirical methods and using identical components, a modified cascode circuit of the present invention is realized. Specifically, recognizing that the performance of a cascode circuit may be improved by utilizing the maximum voltage and current swing available at the output common gate FET, it was found that a saturation current which is higher than that of the output stage common gate FET needs to be effected for the input common source stage.

For the FIG. 1 circuit which uses identical components, it was found that if two identical FETs are connected in parallel, as by connecting drain 6d to drain 8d, gate 6g to gate 8g and source 6s to source 8s of respective FETs 6 and 8, the saturation current of the input common source stage can be increased. The commonly connected sources 6s and 8s are, of course, grounded. By thus connecting in parallel FET 6 and 8, it has further been found that the combined saturation current of FET 6 and 8 becomes greater than that of FET 10. Having a higher saturation current for the input stage, the output provided by the cascode circuit of FIG. 1 has an improved performance—both in terms of better efficiency, higher output power, and higher gain than conventional circuits.

Figure 3A:
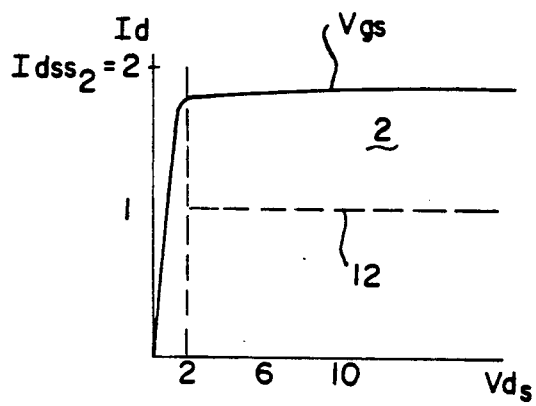
FIG. 3a is a current-voltage (IV) characteristics graph exemplifying the common source FET of FIG. 2.

An explanation of why a higher saturation current for the input stage of a cascode circuit is able to improve the performance of the same is given hereinbelow, with reference to FIGS. 2, 3a and 3b. The saturation current $Idss_2$ of common source FET 2 is greater than saturation current $Idss_4$ of common gate FET 4. For explanation, presuppose that $Idss_2$ is approximately two (2) amps and $Idss_4$ is approximately one (1) amp. Also presume that the I-V characteristics graphs of FIG. 3a and FIG. 3b are representative of common source FET 2 and common gate FET 4, respectively.

Figure 3B:
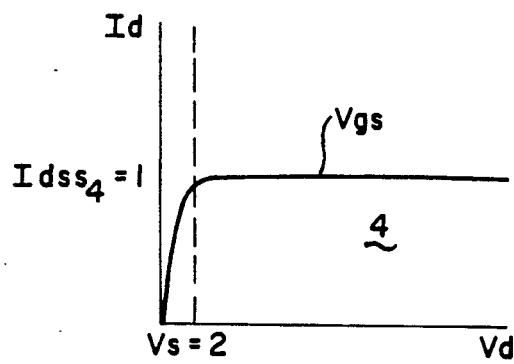
FIG. 3b is an IV characteristics graph exemplifying the common gate FET of FIG. 2 and is aligned with the graph of FIG. 3a to show the relationship between the common source and common gate FETs of the FIG. 2 cascode circuit.

As can be seen in FIG. 3b, the saturation voltage, Vgs, for common gate FET 4 is approximately two volts at saturation current of one amp. FET 2, however, even though having a saturation voltage Vgs that remains at approximately two volts, has a saturation current of approximately two amps. The cascode circuit has FET 2 connected in-series to FET 4, both of the FETs drawing the same current.

Consequently, FET 2 will not reach saturation even were FET 4 have reached its. Moreover, since common source FET 2 has a substantially higher saturation current than common gate FET 4, FET 2 does not dissipate any voltage from FET 4, of such a polarity to reduce the current of FET 4. Thus, the efficiency and power provided by the cascode circuit of the present invention are both superior than those of a conventional cascode circuit.

It should be appreciated that bipolar transistors, in place of FETs, may also be used for the present invention cascode circuit. The only difference between using FETs and bipolar transistors is that FETs, especially in the case of power FETs, have a saturation voltage of approximately two volts, whereas a bipolar transistor has a saturation voltage of only 0.7 volt. Therefore, the relative improvement in the voltage swing for a FET cascode circuit is much greater than that of a bipolar transistor cascode circuit since two volts is a much larger percentage of the maximum voltage swing than 0.7 volt.

Figure 11:
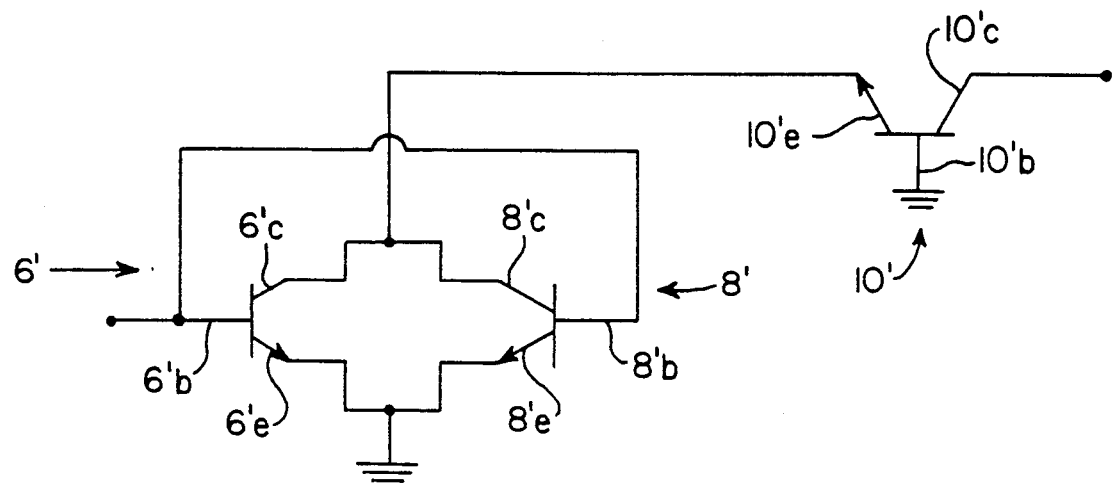
FIG. 11 is a schematic of a modified cascode circuit of the present invention which comprises an input stage having two transistors.
Figure 12:
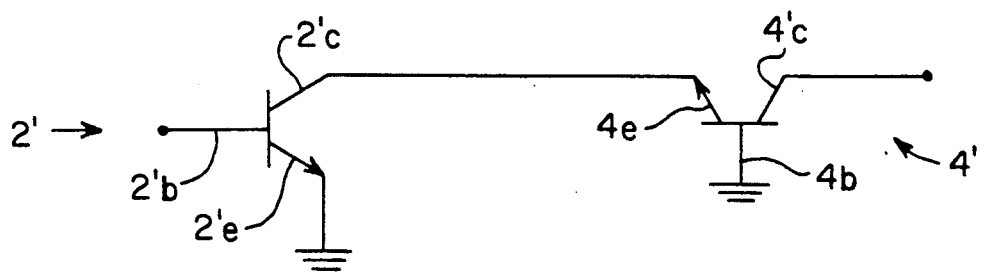
FIG. 12 is a cascode circuit of the present invention which has a single input stage bipolar transistor connected to a common base bipolar transistor.

As shown, FIGS. 11 and 12 correspond functionally to FIGS. 1 and 2, respectively. In particular, FIG. 11 now illustrates a schematic whereby two bipolar transistors are connected in parallel to form an input stage of the cascode circuit. As shown, the bipolar transistors are NPN transistors whose collectors $6'c$ and $8'c$, and emitters $6'e$ and $8'e$ are connected. The output of the connected together collectors is fed to emitter $10'e$ of the output stage bipolar transistor $10'$, which is also illustrated as an NPN transistor. As should readily be appreciated by one skilled in the art, PNP transistors may also be used.

FIG. 12 shows a cascode circuit comprising a bipolar transistor input stage connected to a bipolar transistor output stage. As was stated previously, the only difference between using FETs and bipolar transistors is that there is a difference in the respective saturation voltage amplitudes between the different types of transistors.

Figure 4:
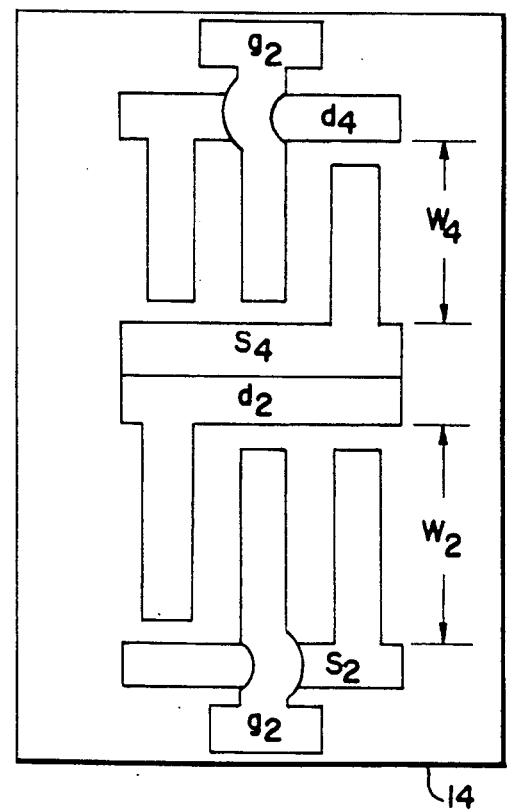
FIG. 4 is a plan view of a substrate having fabricated thereon the different gate, drain and source regions of the FIG. 2 FETs.
Figure 5A:
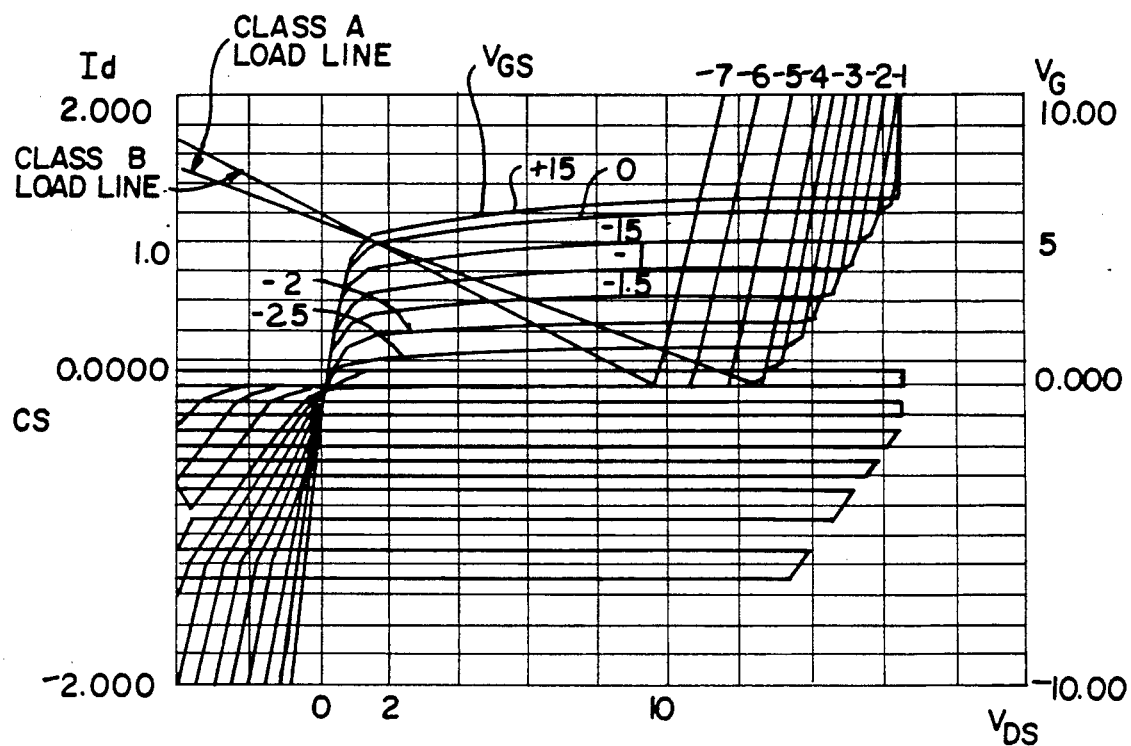
FIG. 5a is an IV characteristics graph of a common source FET.
Figure 5B:
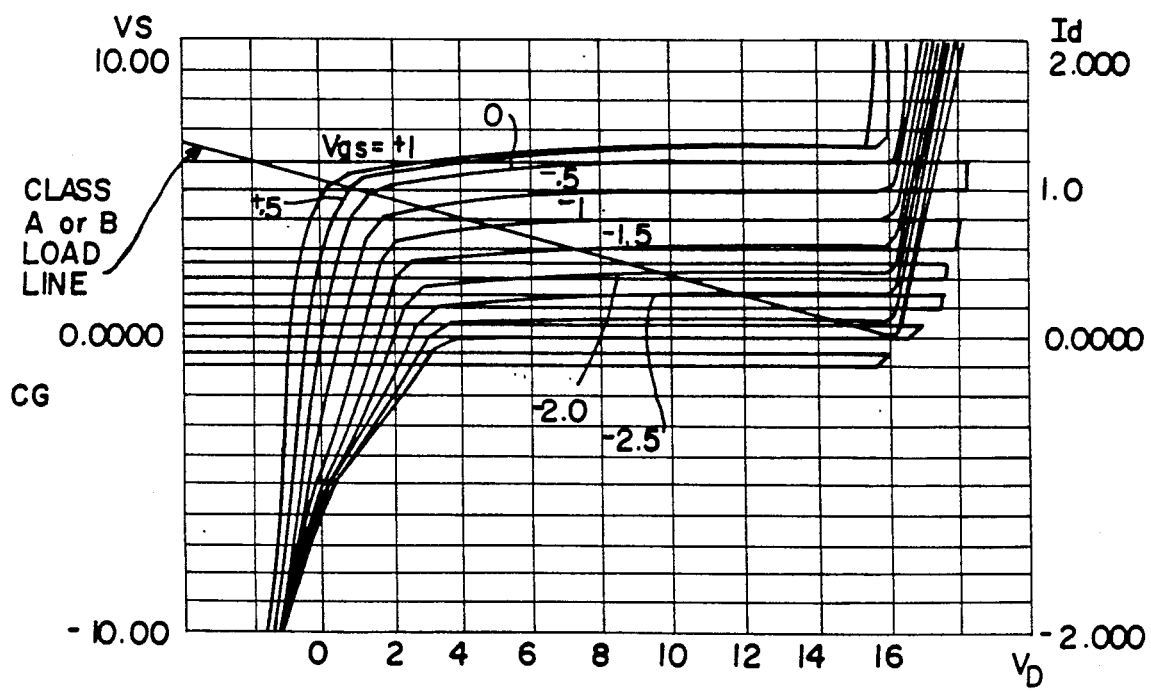
FIG. 5b is an I-V characteristics graph of a common gate FET.

For the fabrication of both the common source FET and the common gate FET onto a single substrate, such as in the case of monolithic microwave integrated circuit technology (MMIC), the way in which the saturation current of the common source FET may be increased over that of the common gate FET is to have a greater width (size) between the source and drain regions of the common source FET than the common gate FET. For example, with reference to FIG. 4 which is a plan view of a substrate having fabricated thereon the different gate, drain and source regions of the FIG. 2 FETs, it can be seen that width $W_2$ (distance between $d_2$ and $S_2$) of common source FET 2 is greater than $W_4$ (distance between $d_4$ and $S_4$) of common gate FET 4. FIG. 5a is an I-V characteristics graph of a common source FET. Also shown are class A and class B amplifier load lines. FIG. 5b, on the other hand, is an I-V characteristics graph of a common gate FET, with corresponding class A and B amplifier load line.

Figure 6:
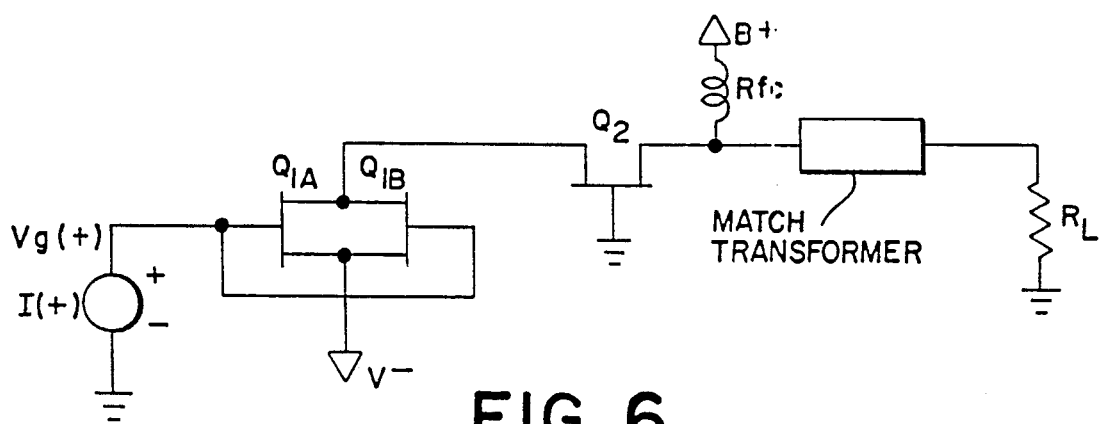
FIG. 6 is broadband power amplifier circuit utilizing the cascode circuit of the present invention.
Figure 8:
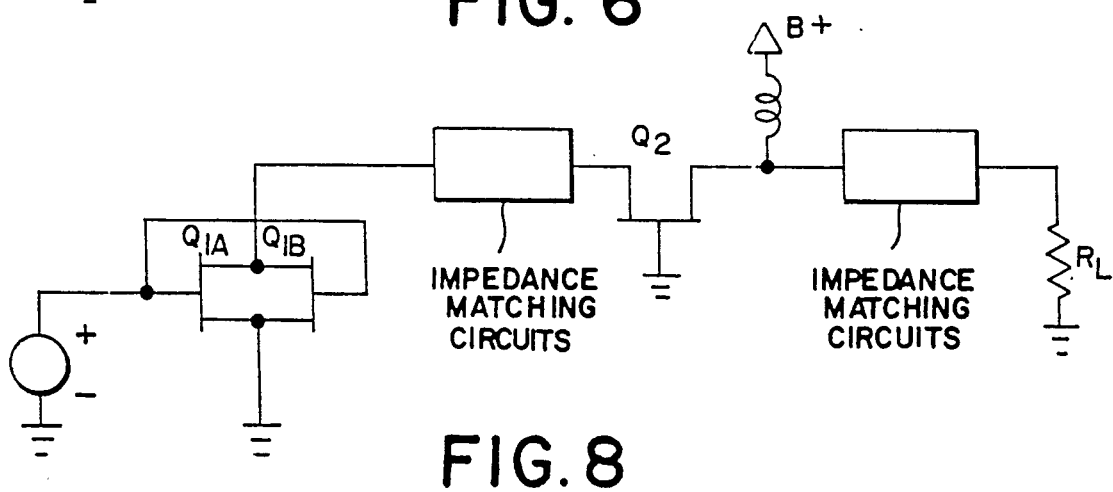
FIG. 8 is a power amplifier circuit having a voltage stepper to eliminate extra bias which utilizes the cascode circuit of the present invention.

Examples of circuits which can utilize the cascode circuit of the present invention are shown in FIGS. 6 and 8. FIG. 6 shows a modified cascode amplifier circuit which uses a match transformer and a tuning circuit; and FIG. 8 shows an interstage matching circuit utilizing a modified cascode circuit of the present invention. Representative I-V characteristics of the FIG. 6 circuit is shown in FIG. 7.

The comparison between class A and class B amplifier circuits using conventional cascode circuits and those using the cascode circuit of the instant invention is given hereinbelow. The parameters and conditions used for this comparison are given in Table 1 shown in FIG. 9. The results obtained are given in FIGS. 10a to 10c.

Figures 7, 9:
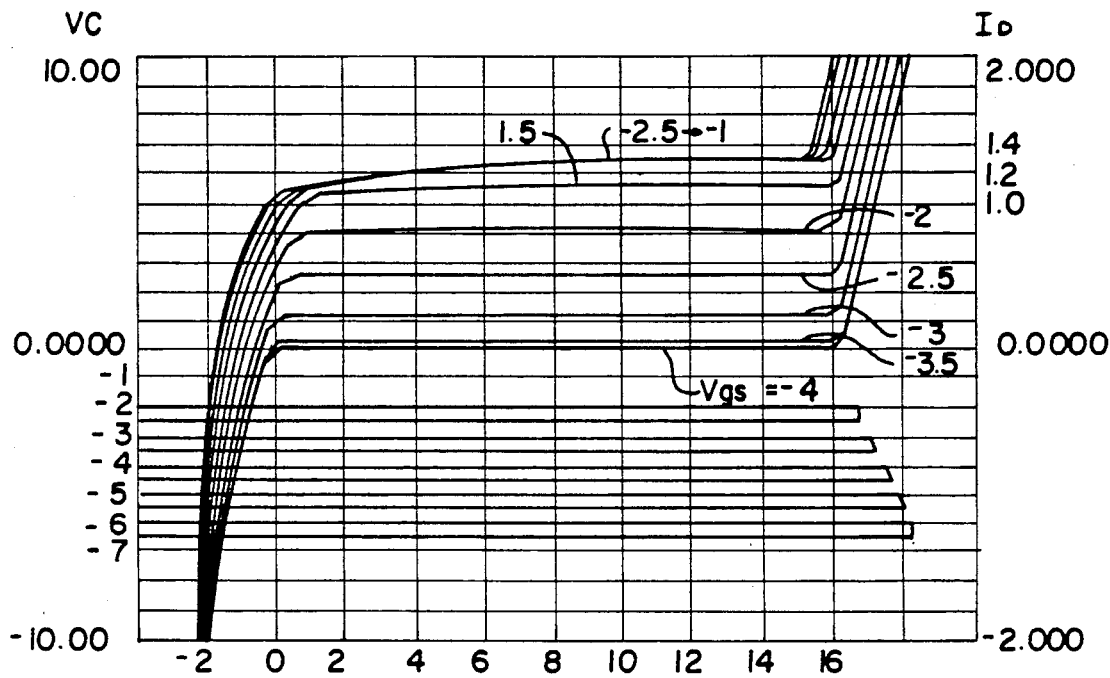
FIG. 7 is an I-V characteristics graph corresponding to the FIG. 6 circuit.
FIG. 9 is a table giving the parameters for comparing conventional cascode circuits with the present invention cascode circuit.

Given the parameters shown in FIG. 9 it can be seen that a class A common source amplifier circuit using a FET with a 1 mm width yields an AC power of approximately 465 milliwatt (mW). The DC voltage $V_{dc}$ for this class A amplifier circuit is approximately 8 volts while its power-added efficiency is 37.5%. Similarly, for a class B amplifier circuit, the AC power drops from 465 mW to 310 mW. The DC voltage, meanwhile, drops down to approximately 6 volts because of the earlier breakdown of a class B load line. (See FIG. 5a.) The power efficiency for the class B amplifier circuit thus is only 52.3%.

For an ideal class B operation, the efficiency should be approximately 78%. For an ideal class A amplifier circuit, the efficiency should be approximately 50%. Therefore, when the ideal efficiencies are compared with the respective efficiencies of class A and B common source amplifier circuits, it can clearly be seen that there is a degradation of the power-added efficiency.

For the power MESFET being used in the modified cascode circuit of the present invention, and whose parameters are given in FIG. 9, FIG. 10a shows that such a power amplifier circuit has a 18 volt peak-to-peak voltage swing, as compared to 12 for the conventional class A and 8 for the conventional class B amplifier circuits. Moreover, approximately 698 mW is obtained for the present invention cascode amplifier circuit irrespective of whether it is being used in a class A or class B amplifier circuit, as compared to the proximate 465 mW for the class A and 310 mW for the class B conventional amplifier circuits. Finally, the power-added efficiency for a class A amplifier circuit using the cascode circuit of the present invention is approximately 50%, which is 12.5% better than the efficiency of a class A amplifier circuit using a conventional cascode circuit. Likewise, for a class B amplifier circuit utilizing the cascode circuit of the present invention, a power efficiency of approximately 78.5%, as compared to the proximate 52.3% of a conventional class B amplifier circuit, is obtained.

It should be appreciated that the power MESFET used for the above comparison is a GaAs device.

Inasmuch as the present invention is subject to many variations, modifications and changes in detail, it is intended that all matter described throughout this specification and shown in the accompanying drawings be interpreted as illustrative only and not in a limiting sense. Accordingly, it is intended that the invention be limited only by the spirit and scope of the appended claims.

I claim:
1. A cascode circuit comprising:
   a common gate FET having a saturation current;
   a common source FET having another saturation current connected to the common gate FEt for driving the same, the saturation current of the common source FET being greater than the saturation current of the common gate FET by a ratio of approximately between 1.5 to 2.0 to ensure that the common gate FET is adaptable to provide a maximum voltage swing at its drain to thereby enhance the performance of the cascode circuit.
2. The cascode circuit according to claim 1 wherein the common gate FET and the common source FET are fabricated on the same substrate to include respective source, drain and gate regions, the ratio of the saturation current between the respective FETs being effected by varying the distances between the source and drain regions of the respective FETs in the substrate.
3. A cascode circuit comprising:
   an output stage including a common gate FET having a saturation current;
   an input stage having at least two common source FETs connected in parallel, and having a combined saturation current greater than that of the common gate FET;
   wherein the connected in parallel common source FETs effectively provide the common gate FET with maximum voltage swing at its drain to enhance the performance of the cascode circuit.
4. The cascode circuit according to claim 3, wherein the saturation current of the combined common source FETs is greater than the saturation current of the common gate FET by a ratio of approximately between 1.5 to 2.0.
5. The cascode circuit according to claim 3, wherein the common gate FET and the common source FETs have substantially identical current voltage characteristics.
6. The cascode circuit according to claim 3, wherein the common gate FET and the common source FETs have different current voltage characteristics.
7. A cascode circuit comprising:
   an output transistor having a first saturation current;
   at least one driver transistor having a second saturation current connected to the output transistor, the saturation current of the driver transistor being greater than the saturation current of the output transistor by a ratio of approximately 1.5 to 2.0 such that no appreciable voltage from the output transistor is dissipated by the driver transistor as the output transistor reaches it saturation current, to thereby enhance the output of the cascode circuit by enabling the output transistor to effect a maximum voltage swing at its output.
8. The cascode circuit according to claim 7, wherein the output and driver transistors are common gate and source FETS, respectively.
9. The cascode circuit according to claim 7, wherein the output transistor is a common base transistor and the driver transistor is a common emitter transistor.
10. A cascode circuit comprising:
    an output stage including a transistor having a saturation current;
    an input stage having at least two transistors connected in parallel, the two input stage transistors being substantially identical to the output stage transistor and having a combined saturation current greater than that of the output stage transistor;
    wherein the connected in parallel input stage transistors effectively ensure that a maximum voltage swing is provided at the output of the output stage transistor for improving the performance of the cascode circuit.
11. The cascode circuit according to claim 10, wherein the output stage and input stage transistors are common gate and common source FETs, respectively.
12. The cascode circuit according to claim 10, wherein the combined saturation current of the input stage is greater than the saturation current of the output stage by a ratio of approximately 1.5 to 2.0.
13. The cascode circuit according to claim 10, wherein the output stage transistor is grounded at its base and the input stage transistors are grounded at their common emitter.

* * * * *

UNITED STATES PATENT AND TRADEMARK OFFICE
CERTIFICATE OF CORRECTION

PATENT NO. : 5,049,835
DATED : September 17, 1991
INVENTOR(S) : Carmine F. Vasile It is certified that error appears in the above-identified patent and that said Letters Patent is hereby corrected as shown below:

Column 2, line 21, after "is" insert --a--.

Column 2, line 56, after "common gate" insert --FET--.

Column 4, line 45, change "is" to --are--.

Column 5, line 38, change "FEt" to --FET--.

Column 6, line 26, change "it" to --its--.

Signed and Sealed this

Thirtieth Day of March, 1993

Attest:

STEPHEN G. KUNIN

*Attesting Officer*      *Acting Commissioner of Patents and Trademarks*